United States Patent
Shiga et al.

(10) Patent No.: US 8,729,676 B2
(45) Date of Patent: May 20, 2014

(54) SILICON EPITAXIAL WAFER AND METHOD FOR MANUFACTURING THE SAME

(75) Inventors: Yutaka Shiga, Annaka (JP); Hiroshi Takeno, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 40 days.

(21) Appl. No.: 13/643,645

(22) PCT Filed: Apr. 28, 2011

(86) PCT No.: PCT/JP2011/002495
§ 371 (c)(1),
(2), (4) Date: Oct. 26, 2012

(87) PCT Pub. No.: WO2011/145279
PCT Pub. Date: Nov. 24, 2011

(65) Prior Publication Data
US 2013/0037920 A1  Feb. 14, 2013

(30) Foreign Application Priority Data
May 20, 2010  (JP) ................................. 2010-116209

(51) Int. Cl.
*H01L 29/04* (2006.01)
(52) U.S. Cl.
USPC ............................ 257/628; 257/255; 438/503
(58) Field of Classification Search
CPC ............................... H01L 29/04; H01L 29/045
USPC ........... 257/255, 627, 628; 438/503, 505, 507
See application file for complete search history.

(56) References Cited

U.S. PATENT DOCUMENTS

| | | | | |
|---|---|---|---|---|
| 6,045,614 | A * | 4/2000 | de Lyon et al. | 117/100 |
| 7,411,274 | B2 * | 8/2008 | Yamanaka et al. | 257/627 |
| 7,989,073 | B2 * | 8/2011 | Dohi et al. | 428/446 |
| 8,133,318 | B2 * | 3/2012 | Daub et al. | 117/14 |
| 2006/0068568 | A1 | 3/2006 | Yanase | |
| 2008/0053368 | A1 * | 3/2008 | Inami et al. | 117/19 |

FOREIGN PATENT DOCUMENTS

| | | |
|---|---|---|
| JP | A-8-26891 | 1/1996 |
| JP | A-2004-265918 | 9/2004 |
| JP | A-2006-100596 | 4/2006 |
| JP | A-2007-70131 | 3/2007 |

OTHER PUBLICATIONS

International Search Report issued in International Application No. PCT/JP2011/002495 on Aug. 16, 2011 (with translation).

* cited by examiner

*Primary Examiner* — Fernando L Toledo
*Assistant Examiner* — Bryan Junge
(74) *Attorney, Agent, or Firm* — Oliff PLC

(57) ABSTRACT

The present invention includes a method for manufacturing a silicon epitaxial wafer having a silicon homoepitaxial layer formed on a surface of a silicon single crystal wafer, including the steps of: preparing the silicon single crystal wafer such that a plane orientation of the silicon single crystal wafer is tilted at an angle in the range from 0.1° to 8° in a <112> direction from a {110} plane; and growing the silicon homoepitaxial layer on the prepared silicon single crystal wafer. According to the present invention, a silicon epitaxial wafer using the {110} substrate with improved surface quality, such as Haze and surface roughness and a method for manufacturing the silicon epitaxial wafer are provided.

4 Claims, 1 Drawing Sheet

SILICON EPITAXIAL WAFER AND METHOD FOR MANUFACTURING THE SAME

TECHNICAL FIELD

The present invention relates to a silicon epitaxial wafer for use in fabrication of a semiconductor device and a method for manufacturing the silicon epitaxial wafer.

BACKGROUND ART

A silicon epitaxial wafer is manufactured, for example, in the following manner.

First, a silicon single crystal wafer is placed in a reaction chamber of a vapor phase epitaxy apparatus. The interior of the reaction chamber is then heated to temperatures from 1100° C. to 1200° C. while a hydrogen gas flows.

Next, a native oxide film ($SiO_2$: Silicon Dioxide) formed on the surface of the wafer is removed after the temperature of the interior of the reaction chamber reaches 1100° C.

In this condition, a silicon raw material gas such as trichlorosilane ($SiHCl_3$) and a dopant gas such as diborane ($B_2H_6$) and phosphine ($PH_3$) are supplied to the interior of the reaction chamber together with a hydrogen gas. A silicon single crystal thin film is grown by the vapor phase epitaxy on the surface of the wafer in this manner.

After growing the thin film, the supply of the raw material gas and dopant gas is stopped, and the reaction chamber is cooled while the wafer is held in a hydrogen atmosphere.

For conventional silicon epitaxial wafers, {100} substrates having a {100} plane as a main plane are mainly used as the substrates on which the silicon single crystal thin film is to be grown by the vapor phase epitaxy.

On the other hand, substrates having a {110} plane as a main plane have a characteristic of higher electron hole mobility than that of the {100} substrates, thereby enabling a faster CMOS. In recent years, the {110} substrates have therefore drawn attention.

The {110} substrate, however, has a problem in that surface quality, such as Haze and surface roughness, greatly deteriorates when a silicon homoepitaxial layer is grown on its surface in comparison with the {100} substrate.

In regard to this problem, studies are being conducted to improve the surface quality, such as Haze and surface roughness, of a silicon epitaxial wafer using the {110} substrate. For example, a method of using a silicon wafer having a plane that is slightly tilted in a <100>, <110>, or <111> direction from the {110} plane to improve the surface quality of the silicon homoepitaxial layer has been known (See Patent Documents 1 and 2).

CITATION LIST

Patent Literature

Patent Document 1: Japanese Unexamined Patent publication (Kokai) No. 2004-265918
Patent Document 2: Japanese Unexamined Patent publication (Kokai) No. 2006-100596

SUMMARY OF INVENTION

The silicon epitaxial wafer manufactured in this manner, however, has inferior surface quality in comparison with the silicon epitaxial wafer manufactured using the {100} substrate to date.

Therefore, there are risks that the detection limit cannot be lowered when surface defects are inspected by a light scattering method and the mobility decreases in fabrication of devices because roughness scattering affects carriers.

There is accordingly a need to improve the surface quality of the silicon epitaxial wafer using the {110} substrate.

The present invention was accomplished in view of the above-described problems. It is an object of the present invention to provide a silicon epitaxial wafer using the {110} substrate with improved surface quality, such as Haze and surface roughness, and a method for manufacturing the silicon epitaxial wafer.

To achieve this object, the present invention provides a silicon epitaxial wafer having a silicon homoepitaxial layer grown on a surface of a silicon single crystal wafer, in which the silicon single crystal wafer has a plane orientation tilted at an angle in the range from 0.1° to in a <112> direction from a {110} plane.

In such a silicon epitaxial wafer, steps are formed on the surface of the silicon homoepitaxial layer, and a {110} facet is formed at a step edge; therefore the steps are stably grown. The inventive silicon epitaxial wafer therefore has the improved surface quality and is advantageous to device fabrication.

Furthermore, the present invention provides a method for manufacturing a silicon epitaxial wafer having a silicon homoepitaxial layer grown on a surface of a silicon single crystal wafer, including the steps of: preparing the silicon single crystal wafer such that a plane orientation of the silicon single crystal wafer is tilted at an angle in the range from 0.1° to 8° in a <112> direction from a {110} plane; and growing the silicon homoepitaxial layer on the surface of the prepared silicon single crystal wafer.

According to the manufacturing method, steps are formed on the surface of the silicon homoepitaxial layer during its growth, and a {110} facet is formed at a step edge; therefore the steps can be stably grown. The surface quality of the silicon homoepitaxial layer can therefore be improved.

In the step of preparing the silicon single crystal wafer, a silicon single crystal ingot grown in a <110> direction by the Czochralski method can be sliced while the silicon single crystal ingot is tilted at an angle in the range from 0.1° to 8° in the <112> direction to prepare the silicon single crystal wafer.

By this manner, a target silicon single crystal wafer can be readily prepared with a conventional equipment.

Alternatively, in the step of preparing the silicon single crystal wafer, a silicon single crystal ingot can be grown by the Czochralski method using a seed crystal tilted at an angle in the range from 0.1° to 8° in the <112> direction from the {110} plane, and the grown silicon single crystal ingot can be sliced perpendicularly to an axis of the silicon single crystal ingot to prepare the silicon single crystal wafer.

By this manner, a target silicon single crystal wafer can be readily prepared with a conventional equipment.

In the method for manufacturing a silicon epitaxial wafer of the present invention, the silicon homoepitaxial layer is grown by using a silicon single crystal wafer having a plane orientation tilted at an angle in the range from 0.1° to 8° in the <112> direction from the {110} plane. A silicon epitaxial wafer using the {110} substrate with improved surface quality such as Haze and surface roughness can therefore be manufactured. The inventive silicon epitaxial wafer with improved surface quality reduces the influence of roughness scattering on carriers to realize high mobility and can therefore be advantageously used in device fabrication such as CMOS.

DESCRIPTION OF EMBODIMENTS

Hereinafter, embodiments of the present invention will be described, but the present invention is not limited to these embodiments.

Figure 1:
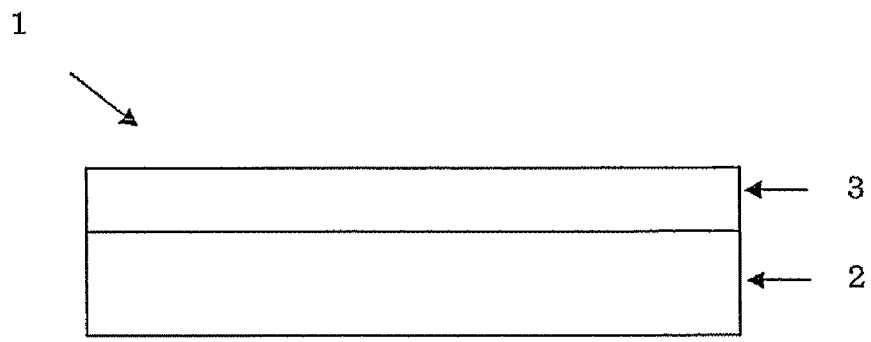
FIG. 1 is a schematic view showing an example of the silicon epitaxial wafer of the present invention.

As shown in FIG. 1, the silicon epitaxial wafer 1 of the present invention includes the silicon single crystal wafer 2, and the silicon homoepitaxial layer 3 formed by the vapor phase epitaxy on a main surface of the silicon single crystal wafer 2.

The silicon single crystal wafer 2 has a plane orientation tilted at an angle in the range from 0.1° to 8° in the <112> direction from the {110} plane.

A main feature of utilizing, for a semiconductor integrated circuit device, the silicon epitaxial wafer using the silicon single crystal wafer 2 having a plane orientation tilted at an angle in the range from 0.1° to 8° in the <112> direction from the {110} plane is that electron hole mobility in a p-type FET in the <110> direction becomes higher in comparison with the case of the {100} plane. Therefore, in a semiconductor integrated circuit device in which electron mobility in an n-type FET in the silicon epitaxial wafer is increased to electron mobility of the {100} plane or more, fabricating the device such that electrons and electron holes flow in a <110> channel direction realizes further shrinking the feature size of a circuit device.

In the silicon epitaxial wafer having the silicon homoepitaxial layer 3 grown on the surface of the silicon single crystal wafer 2 having a plane orientation tilted at an angle in the range from 0.1° to 8° in the <112> direction from the {110} plane, steps are formed on the surface of the silicon homoepitaxial layer 3, and a {110} facet is formed at a step edge; therefore the steps are stably grown. That is, the surface is flattened at an atomic level. In addition, the influence of roughness scattering on carriers is reduced to realize high mobility. Therefore, the silicon epitaxial wafer can be advantageously used in device fabrication such as CMOS.

Here, the silicon single crystal wafer 2 may be a p-type wafer doped with, for example, boron or a n-type wafer doped with, for example, phosphorus, antimony, or arsenic. Also, elements other than the dopant such as carbon, germanium, and nitrogen may be added into the silicon single crystal wafer for purposes of gettering and so on Next, the method for manufacturing a silicon epitaxial wafer of the present invention will be described.

Figure 2:
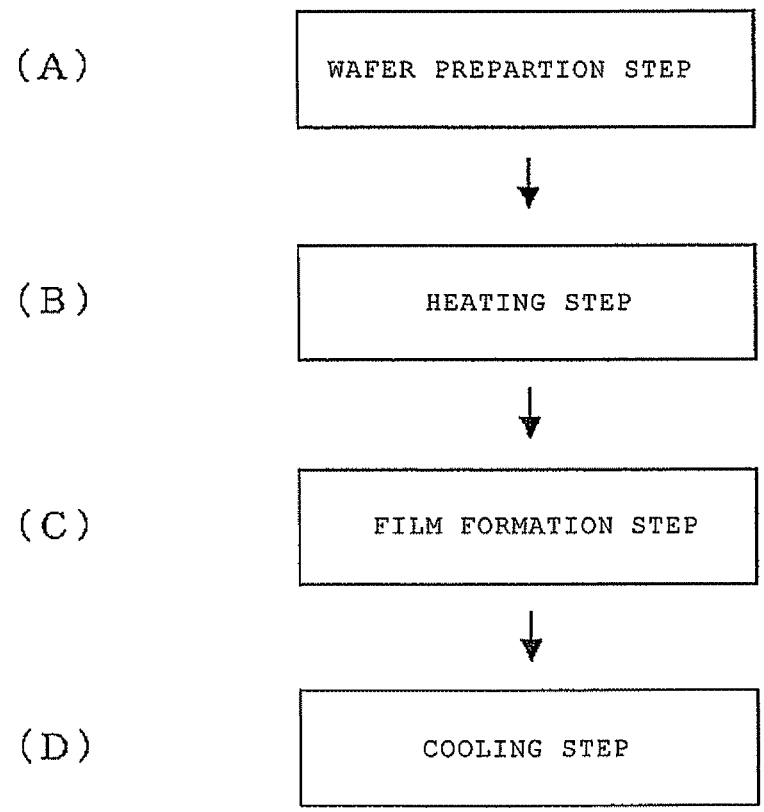
FIG. 2 is a flow chart showing an example of the method for manufacturing a silicon epitaxial wafer of the present invention.

As shown in FIG. 2 at (A), a silicon single crystal wafer having a plane orientation tilted at an angle in the range from 0.1° to 8° in the <112> direction from the {110} plane is prepared. This silicon single crystal wafer can be obtained by growing a silicon single crystal ingot by the Czochralski method and machining the grown silicon single crystal ingot in the following manner, for example.

A silicon single crystal ingot is grown in the <110> direction by the Czochralski method.

In the growth, a dopant being added is not limited in particular. The silicon single crystal ingot may be grown while its conductivity type and resistivity are controlled and the dopant is added according to the target silicon epitaxial wafer. Also, elements other than the dopant such as carbon, germanium, and nitrogen may be added.

The silicon single crystal ingot grown is then sliced while the silicon single crystal ingot is tilted at an angle in the range from 0.1° to 8° in the <112> direction. Lapping, etching, polishing processes are then performed to produce the silicon single crystal wafer.

Common methods can be used to slice the silicon single crystal ingot. For example, the silicon single crystal ingot can be sliced while the tilted angle is controlled with a slicing apparatus such as an inner diameter slicer and a wire saw. The lapping, etching, polishing processes can be performed in common conditions. The conditions can be appropriately selected according to the specifications of the silicon epitaxial wafer being manufactured.

The silicon single crystal wafer having a plane orientation tilted at an angle in the range from 0.1° to 8° in the <112> direction from the {110} plane can be prepared as above.

An alternative method that can be implemented herein is as follows: the silicon single crystal ingot is grown by the Czochralski method using a seed crystal tilted at an angle in the range from 0.1° to 8° in the <112> direction from the {110} plane; the grown silicon single crystal ingot is then sliced perpendicularly to the axis of the silicon single crystal ingot.

Next, the silicon homoepitaxial layer 3 is grown by the vapor phase epitaxy on the surface of the silicon single crystal wafer 2 prepared as above to manufacture the silicon epitaxial wafer 1.

The vapor phase epitaxy method can be implemented in common conditions. For example, the silicon homoepitaxial layer can be grown by the vapor phase epitaxy in the following manner.

First, as shown in FIG. 2 at (B), the silicon single crystal wafer 2 is placed in the reaction chamber of the vapor phase epitaxy apparatus. The interior of the reaction chamber is then heated to temperatures from 1100° C. to 1200° C. while a hydrogen gas flows.

A native oxide film formed on the surface of the silicon single crystal wafer 2 is removed after the temperature of the interior of the reaction chamber reaches 1100° C.

In this condition, as shown in FIG. 2 at (C), a silicon raw material gas such as trichlorosilane ($SiHCl_3$) and a dopant gas such as diborane ($B_2H_6$) or phosphine ($PH_3$) are supplied to the interior of the reaction chamber together with a hydrogen gas. A silicon single crystal thin film as the silicon homoepitaxial layer 3 is grown by the vapor phase epitaxy on the surface of the silicon single crystal wafer 2.

As shown in FIG. 2 (D), after growing the thin film, the supply of the raw material gas and dopant gas is stopped, and the reaction chamber is cooled while the wafer is held in a hydrogen atmosphere.

Here, physical properties (the thickness, conductivity type, resistivity and the like) of the silicon homoepitaxial layer 3 being grown can be optionally selected for the later-fabricated device.

In this manner, when the silicon homoepitaxial layer 3 is grown on the surface of the silicon single crystal wafer 2 having a plane orientation tilted at an angle in the range from 0.1° to 8° in the <112> direction from the {110} plane, steps are formed on the surface, and the {110} facet is formed at the step edge. Therefore, the steps can be stably grown and the surface quality of the silicon homoepitaxial layer 3 can be improved.

EXAMPLE

The present invention will be more specifically described below with reference to Example and Comparative Examples, but the present invention is not limited to this example.

Example

Silicon epitaxial wafers were manufactured according to the method for manufacturing a silicon epitaxial wafer of the present invention. The surface quality of the manufactured silicon epitaxial wafer was evaluated.

First, a silicon single crystal ingot having a diameter of 300 mm was grown in the <110> direction by the Czochralski method. The silicon single crystal ingot was then sliced into wafers while the ingot was tilted at an angle in the range from 0.1° to 8° in the <112> direction. Here, the wafers were p-type wafers doped with boron and their resistivity were 5 to 15 Ωcm. The tilted angles in the range from 0.1° to 8° in the <112> direction, used herein included 0.1°, 1°, 2°, 3°, 4°, 6°, and 8°.

A common grinding and polishing processes were performed on these silicon single crystal wafers so that the wafers were in a mirror status. An RCA cleaning process was then performed. The silicon homoepitaxial layer was grown on each of the mirror-polished silicon single crystal wafers obtained as above. The epitaxial growth conditions included: p-type boron dopant; a resistivity of 5 to 15 Ωcm; and a grown silicon homoepitaxial layer thickness of 5 μm. Trichlorosilane was used as the raw material gas to cause reaction in a single-wafer-processing reactor at 1150° C. under a hydrogen atmosphere.

The surface roughness of the manufactured silicon epitaxial wafers was measured by AFM and its Haze was measured with a particle counter As a result, it was confirmed that Haze and the surface roughness were improved at least by 20 percent compared with the results of the later-described Comparative Examples 1 and 2.

It was accordingly confirmed that a silicon epitaxial wafer using the {110} substrate with improved surface quality, such as Haze and surface roughness, can be manufactured by the method for manufacturing a silicon epitaxial wafer of the present invention.

Comparative Example 1

Silicon epitaxial wafers were manufactured in the same conditions as Example except that the tilted angles in the <112> direction were 0° and 10° to evaluate as in Example.

As a result, it was confirmed that Haze and the surface roughness deteriorated approximately ten times in the case of a tilted angle of 0° and by approximately 30 percent in the case of a tilted angle of 10° compared with the results of Example. The tilted angle in the <112> direction accordingly needs to be in the range from 0.1° to 8° to ensure the effects of the present invention.

Comparative Example 2

Silicon epitaxial wafers were manufactured in the same conditions as Example except that the tilted directions were the <100> direction, the <110> direction, and the <111> direction to evaluate as in Example.

As a result, it was confirmed that Haze and the surface roughness deteriorated by approximately 20 percent in the case of the tilted angle of the <100> direction and by approximately 30 percent in the cases of the tilted angle of the <110> direction and the <111> direction compared with the results of Example.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicon epitaxial wafer having a silicon homoepitaxial layer grown on a surface of a silicon single crystal wafer, wherein the silicon single crystal wafer has a plane orientation tilted at an angle in the range from 0.1° to 8° in a <112> direction from a {110} plane.

2. A method for manufacturing a silicon epitaxial wafer having a silicon homoepitaxial layer grown on a surface of a silicon single crystal wafer, the method comprising the steps of:
   preparing the silicon single crystal wafer such that a plane orientation of the silicon single crystal wafer is tilted at an angle in the range from 0.1° to 8° in a <112> direction from a {110} plane; and
   growing the silicon homoepitaxial layer on the surface of the prepared silicon single crystal wafer.

3. The method for manufacturing a silicon epitaxial wafer according to claim 2, wherein, in the step of preparing the silicon single crystal wafer, a silicon single crystal ingot grown in a <110> direction by the Czochralski method is sliced while the silicon single crystal ingot is tilted at an angle in the range from 0.1° to 8° in the <112> direction to prepare the silicon single crystal wafer.

4. The method for manufacturing a silicon epitaxial wafer according to claim 2, wherein, in the step of preparing the silicon single crystal wafer, a silicon single crystal ingot is grown by the Czochralski method using a seed crystal tilted at an angle in the range from 0.1° to 8° in the <112> direction from the {110} plane, and the grown silicon single crystal ingot is sliced perpendicularly to an axis of the silicon single crystal ingot to prepare the silicon single crystal wafer.

\* \* \* \* \*